United States Patent
Mielke et al.

(10) Patent No.: US 10,214,885 B2
(45) Date of Patent: Feb. 26, 2019

(54) METHOD FOR OPERATING A SANITARY FITTING

(71) Applicant: Grohe AG, Hemer (DE)

(72) Inventors: Achim Mielke, Porta Westfalica (DE); Felix Hamer, Iserlohn (DE)

(73) Assignee: Grohe AG, Hemer (DE)

( * ) Notice: Subject to any disclaimer, the term of this patent is extended or adjusted under 35 U.S.C. 154(b) by 0 days.

(21) Appl. No.: 15/268,893

(22) Filed: Sep. 19, 2016

(65) Prior Publication Data

US 2017/0081832 A1    Mar. 23, 2017

(30) Foreign Application Priority Data

Sep. 17, 2015  (DE) .................. 10 2015 011 811

(51) Int. Cl.
*E03C 1/05*    (2006.01)
*E03C 1/04*    (2006.01)
*H03K 17/96*   (2006.01)

(52) U.S. Cl.
CPC ............. *E03C 1/055* (2013.01); *E03C 1/04* (2013.01); *H03K 17/962* (2013.01); *Y10T 137/9464* (2015.04)

(58) Field of Classification Search
USPC ........................................... 137/801
See application file for complete search history.

(56) References Cited

U.S. PATENT DOCUMENTS

| | | | | |
|---|---|---|---|---|
| 4,735,357 A * | 4/1988 | Gregory | .................. | E03C 1/057 137/801 |
| 5,031,258 A * | 7/1991 | Shaw | ..................... | E03C 1/057 242/563 |
| 6,000,429 A * | 12/1999 | Van Marcke | ............ | E03C 1/05 137/624.11 |
| 7,069,941 B2 * | 7/2006 | Parsons | ..................... | E03C 1/05 137/1 |
| 8,376,313 B2 * | 2/2013 | Burke | ..................... | E03C 1/057 251/129.04 |
| 2001/0014835 A1 * | 8/2001 | Gauthier | .................. | E03C 1/05 700/32 |
| 2005/0150557 A1 | 7/2005 | McDaniel et al. | | |
| 2006/0101575 A1 * | 5/2006 | Louis | ..................... | E03C 1/046 4/676 |
| 2007/0069169 A1 | 3/2007 | Lin | | |
| 2010/0170570 A1 | 7/2010 | Rodenbeck et al. | | |
| 2011/0253220 A1 | 10/2011 | Sawaski et al. | | |
| 2014/0250590 A1 | 9/2014 | Keiter et al. | | |

FOREIGN PATENT DOCUMENTS

DE    10 2013 003 824 A1    9/2014

* cited by examiner

*Primary Examiner* — John K Fristoe, Jr.
*Assistant Examiner* — Daphne M Barry
(74) *Attorney, Agent, or Firm* — Muncy, Geissler, Olds & Lowe, P.C.

(57) ABSTRACT

A method for operating a sanitary fitting having a housing with a spout and a touch sensor, wherein in a touch mode of the sanitary fitting a tapping of a fluid can be activated by touching the touch sensor and wherein by touching the touch sensor for a period of at least 3 seconds, the touch mode is disabled. In addition, a sanitary fitting is specified, which controller is designed and provided for performing the method.

10 Claims, 1 Drawing Sheet

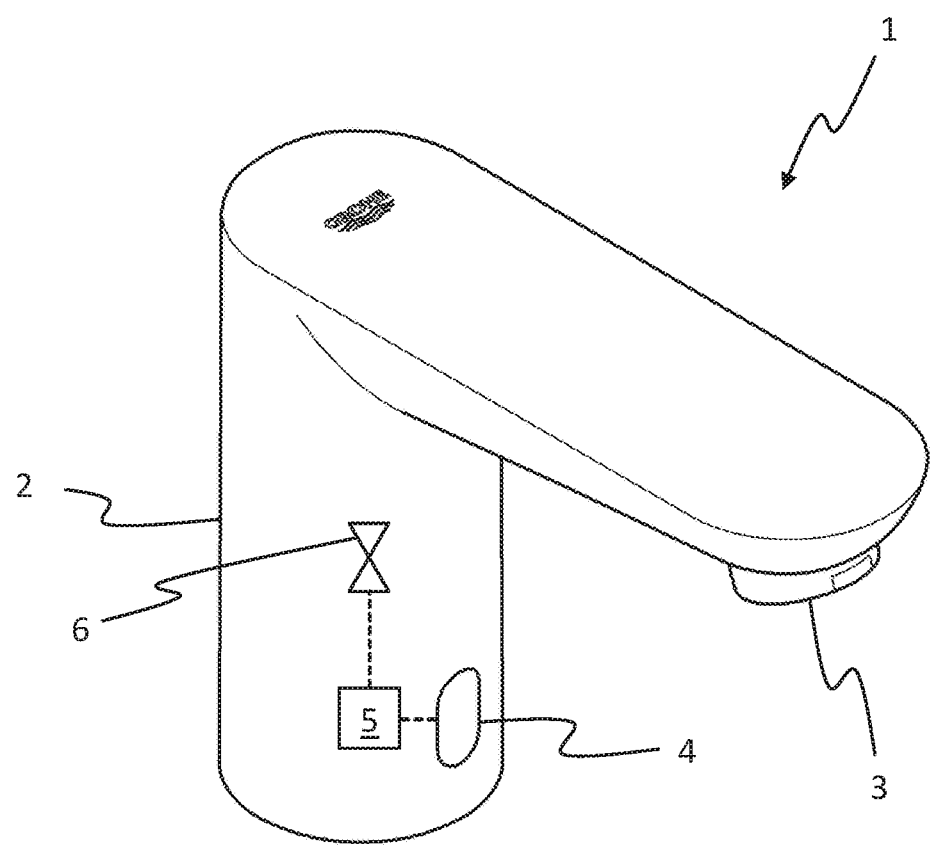

METHOD FOR OPERATING A SANITARY FITTING

This nonprovisional application claims priority under 35 U.S.C. § 119(a) to German Patent Application No. 10 2015 011 811.0, which was filed in Germany on Sep. 17, 2015, and which is herein incorporated by reference.

BACKGROUND OF THE INVENTION

Field of the Invention

The present invention relates to a method for operating a sanitary fitting and a sanitary fitting, which is used to tap a fluid. Such sanitary fittings are regularly used in conjunction with sinks, wash basins, showers and/or bathtubs.

Description of the Background Art

From the prior art, sanitary fittings are known in which the tapping or release of fluid (water) can be activated by touching a touch sensor. A disadvantage of such sanitary fittings is that during cleaning and/or maintenance, undesired activation of fluid release can occur by touching the touch sensor, resulting in greater or undesired fluid consumption. To avoid this problem, the touch sensor could be temporarily disabled in such sanitary fittings, wherein an interruption of the power supply to the sanitary fitting and/or for this purpose, additionally provided switches below the sanitary fitting, for example, on an under-the-counter control of the sanitary fitting, could be used. Such temporary disabling of the touch sensor for cleaning/maintenance of the sanitary fitting is, however, expensive and/or complicated.

SUMMARY OF THE INVENTION

It is therefore the object of the invention to provide a method for operating and for the temporary and need-based inactivation of a sanitary fitting, and a sanitary fitting, which are characterized by simple deactivatability of the touch sensor.

To this end, a method for operating a sanitary fixture is provided, the sanitary fitting having a housing with a spout and a touch sensor, wherein in a touch mode of the sanitary fitting, by touching the touch sensor, a tapping of a fluid can be activated, and wherein the touch mode is disabled when the touch sensor is touched for a period of at least 3 seconds.

The sanitary fitting can be used in particular for the needs-based provision of a fluid, such as water. The fluid may also be mixed water that is mixed through the sanitary fitting from cold water with a cold water temperature of 0° C. (Celsius) to 40° C. and hot water with a hot water temperature of 40° C. to 80° C. For this purpose, the sanitary fitting may, for example, comprise a mixing valve or a thermostatic valve. These can be operated in particular via an actuator such as a lever or the like, of the sanitary fitting. Such sanitary fittings are used regularly in connection with sinks, wash basins, showers and/or bathtubs. The sanitary fitting has a housing with a spout and a touch sensor. The housing and/or the spout may be at least partially made of a plastic and/or metal, such as brass.

By touching the touch sensor, which may in particular be a capacitive sensor, the release of fluid from the sanitary fitting can be activated, when the sanitary fitting is in a touch mode. In particular, for the purpose of cleaning and/or maintenance of the sanitary fitting, the touch mode can be disabled if the touch sensor is touched for a period of at least 3 seconds, preferably at least 6 seconds. Thus, the touch mode can be switched off by a user with a particularly long touch of the touch sensor, or it can be set to inactive, without additional switches and/or even interruption of the power supply of the sanitary fitting being required. By disabling the touch mode, in particular, the touch sensor and/or a control of the sanitary fixture can be adjusted or disabled in such a way, that activation of the tapping of the fluid over the touch sensor is not possible for a certain period of time. Nevertheless, the release of fluid can continue to be made by mechanical actuators.

It is noted that during the period of the "disabled touch mode", the sensitivity of the touch sensor can be turned off, but this is not mandatory. This means that a user touching a touch sensor during this period could very well be detected, however, release of the fluid is not prompted. The release is only again granted when specific conditions are met and the touch mode is active again.

Moreover, it is advantageous if the touch mode is disabled for a (predetermined) period of at least 2 minutes. This ensures that the touch mode is disabled sufficiently long for a cleaning of the sanitary fitting.

In addition, it is advantageous if the disabling of the touch mode is confirmed by the release of fluid from the spout. In other words, the sanitary fitting releases a (small) amount of fluid, possibly with a predetermined spray pattern, at the end of the disabled period and/or at the start of the reactivation of the touch mode. This way, for example, additional signal lights indicating the disabling of the touch mode are not required.

Further, in an exemplary embodiment, each time the touch mode is changed, for example, enabled or disabled, a confirmation signal is displayed such as via a light or a short burst of water from the faucet.

Furthermore, it is advantageous in this context if the release of the fluid occurs for a maximum of 2 seconds. The release of the fluid preferably occurs for a maximum of 1 second, or more preferably, for a maximum of 0.5 seconds. This can prevent unnecessary consumption of fluid.

Moreover, it is advantageous if the touch mode is automatically reactivated after it has been disabled for a certain time. In particular, no further actions or operations by a user are then required to reactivate the touch mode. The time period can be, for example, a duration of 1 to 3 minutes.

It may also be advantageous if the touch mode after its disabling by touching the touch sensor is reactivated for a period of at least 3 seconds. In other words, this means, for example, that the touch mode is turned on again by means of a specially designed actuator or contacting of the touch sensor, at an earlier time than the time usually prescribed. The activation of the touch mode is preferably carried out by touching the touch sensor for a period of at least 6 seconds.

Preferably, the activation of the touch mode (premature and initiated by the user) can be confirmed by the release of fluid from the spout. The amount or the manner of the release of fluid can be adapted for this purpose, e.g., as already described above.

Following a further aspect, a sanitary fitting is also proposed that has a housing with a spout and a touch sensor for activating a tapping of a fluid, wherein a touch mode of the sanitary fitting is controllable or adjustable by a controller, which is adapted and provided for carrying out the method described herein. The controller may be, for example, a microprocessor that is data-conductively and/or electro conductively connected to the touch sensor and/or a valve for controlling the release of fluid from the spout. For further details, reference is made to the foregoing description of the process.

BRIEF DESCRIPTION OF THE DRAWING

The present invention will become more fully understood from the detailed description given hereinbelow and the accompanying drawing which is given by way of illustration only, and thus, is not limitive of the present invention, and wherein the sole FIGURE illustrates an example embodiment, showing a cross-sectional view of an adjustment fitting with a sealing of an eccentric receiving space.

DETAILED DESCRIPTION

Schematically and by way of example, the FIGURE shows a sanitary fitting 1 with a housing 2 and a spout 3. On the housing 2 of the sanitary fitting 1, a touch sensor 4 is arranged, which is data-conductively or electro conductively connected to a controller 5 of the sanitary fitting 1. The controller 5 is configured and provided for performing the method proposed here, so that with the controller 5, a disabling of a touch mode of the sanitary fitting 1 can occur when the touch sensor 4 is touched for a period of at least 3 seconds. During the disabling of the touch mode, no release of fluid (especially water) occurs in spite of a (usual or short-term) touching of the touch sensor 4, for example, when cleaning the sanitary fitting 1. For this purpose, the controller 5 is data-conductively connected to a valve 6 which is closed during the disabling of the touch mode by the controller 5. The valve 6 is arranged in a line not shown here, via which the fluid can be conducted to the spout 3 through the sanitary fitting 1.

The proposed sanitary fitting is characterized in particular by an operating mode that is particularly convenient to disable.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for operating a sanitary fitting, the sanitary fitting comprising a housing with a spout and a touch sensor, the method comprising:
    enabling a touch mode of the sanitary fitting, the touch mode allowing a flow of a fluid, wherein during the touch mode, the flow of the fluid is activated by touching the touch sensor; and
    disabling the touch mode by touching the touch sensor for a first predetermined period of time, wherein the disabling of the touch mode prohibits activation of the flow of the fluid when the touch sensor is touched during a second predetermined period of time,
    wherein the touch mode is automatically reactivated upon expiration of the second predetermined time period, and
    wherein the reactivation of the touch mode is confirmed by a release of fluid from the spout.

2. The method according to claim 1, wherein the second predetermined period of time, during which the touch mode is disabled, is a period of 1 to 3 minutes.

3. The method according to claim 1, wherein the disabling of the touch mode is confirmed by a release of fluid from the spout.

4. The method according to claim 3, wherein the release of the fluid at disabling of the touch mode occurs for a maximum of 2 seconds.

5. The method according to claim 1, wherein the release of the fluid at reactivation occurs for a maximum of 2 seconds.

6. The sanitary fitting comprising:
    the housing;
    the spout; and
    the touch sensor for activation of a flow of the fluid, wherein the touch mode of the sanitary fitting is controllable by a controller configured to perform the method according to claim 1.

7. The method according to claim 1, wherein the first predetermined period of time is 3 to 6 seconds.

8. The method according to claim 1, wherein during the touch mode, the flow of the fluid is activated by touching the touch sensor for less than the first predetermined period of time.

9. A method for operating a sanitary fitting, the sanitary fitting comprising a housing with a spout and a touch sensor, the method comprising:
    enabling a touch mode of the sanitary fitting, the touch mode allowing a flow of a fluid, wherein during the touch mode, the flow of the fluid is activated by touching the touch sensor; and
    disabling the touch mode by touching the touch sensor for a first predetermined period of time, wherein the disabling of the touch mode prohibits activation of the flow of the fluid when the touch sensor is touched during a second predetermined period of time,
    wherein the touch mode is automatically reactivated upon expiration of the second predetermined time period, and
    wherein the touch mode is reactivatable before the expiration of the second predetermined period by touching the touch sensor for a third predetermined period of time.

10. The method according to claim 9, wherein the third predetermined period of time is 3 to 6 seconds.

* * * * *